United States Patent [19]
Becker et al.

[11] Patent Number: 5,331,651
[45] Date of Patent: Jul. 19, 1994

[54] METHOD AND APPARATUS FOR ADJUSTING THE WAVELENGTH IN AN OPTICAL DEVICE AND LASER USING THE METHOD

[75] Inventors: Michael Becker, Gaertringen; Wolfgang Reichert; Emmerich Müller, both of Aldingen, all of Fed. Rep. of Germany

[73] Assignee: Hewlett-Packard Company, Palo Alto, Calif.

[21] Appl. No.: 7,564

[22] Filed: Jan. 22, 1993

[30] Foreign Application Priority Data

Jan. 24, 1992 [EP] European Pat. Off. ........ 92101168.0

[51] Int. Cl.⁵ ............................................. H01S 3/13
[52] U.S. Cl. ....................................... 372/32; 372/15; 372/20; 372/102; 359/210
[58] Field of Search ................. 372/15, 19, 20, 102, 372/32; 359/210, 211

[56] References Cited

U.S. PATENT DOCUMENTS

| | | | |
|---|---|---|---|
| 3,555,280 | 1/1971 | Richards, Jr. | 250/201 |
| 3,622,909 | 11/1971 | Woodcock | 331/94.5 |
| 4,660,204 | 4/1987 | Dewhirst et al. | 372/20 X |
| 4,751,706 | 6/1988 | Rohde et al. | 372/20 X |
| 4,823,351 | 4/1989 | Endemann et al. | 372/15 X |
| 4,829,536 | 5/1989 | Kajiyama et al. | 372/19 X |
| 5,048,031 | 9/1991 | Thonn | 372/20 X |
| 5,161,165 | 11/1992 | Zorabedian | 372/102 X |
| 5,206,867 | 4/1993 | Esterowitz et al. | 372/105 X |

OTHER PUBLICATIONS

Okada, Masakatsu et al., "Tilted Birefringent Fabry-Perot Etalon for Tuning Dye Lasers," Applied Optics, vol. 15, No. 2, Feb. 1976, pp. 472–476.

Beenen, G. J., et al., "Accurate Wavelength Calibration Of An Etalon-Tuned Dye Laser," Applied Spectroscopy, vol. 35, No. 6, Nov./Dec. 1981, pp. 593–598.

Smith, David W., "Coherent Fiberoptic Communications," Laser Focus/Electro-Optics, vol. 21, No. 11, Nov. 1985, pp. 92–106.

Primary Examiner—John D. Lee
Assistant Examiner—Hemang Sanghavi

[57] ABSTRACT

In a method and a corresponding apparatus for adjusting the wavelength in an optical device, a wavelength selective filter element, for example a Fabry-Perot etalon, whose wavelength characteristic depends on the angle of incidence ($\alpha_{min}$) of the light beam on the filter element is arranged on a shaft which can be rotated by a motor. The filter element is mounted to the shaft such that its surface normal forms an angle ($\gamma_o$) with the axis. The shaft itself is inclined relative to the axis of the light beam passing through the filter element. When the axis is rotating, the angle of incidence of the light beam on the filter element changes, resulting in a change of the wavelength of the transmitted beam. By rotating the axis, very small changes of the angle of incidence and thus of the wavelength can be precisely adjusted. The invention can be used in an external cavity laser comprising a semiconductor laser chip, a lens and a grating. Rotation of the grating by a drive unit provides for coarse tuning of the output wavelength of the external cavity laser and rotation of the filter element provides for fine tuning.

18 Claims, 4 Drawing Sheets

METHOD AND APPARATUS FOR ADJUSTING THE WAVELENGTH IN AN OPTICAL DEVICE AND LASER USING THE METHOD

FIELD OF THE INVENTION

The invention relates to a method and a corresponding apparatus for adjusting the wavelength in an optical device and to a laser using the method.

BACKGROUND OF THE INVENTION

In a method of the mentioned type, the wavelength is adjusted by means of a wavelength selective filter element through which a beam of radiation is transmitted, whereby the adjusted wavelength depends on the angle of inclination of the filter element relative to the optical axis. A typical filter element of this kind is a Fabry-Perot etalon. The wavelength of the transmitted radiation is adjusted by tilting the etalon relative to the optical axis.

An example of an optical device wherein a Fabry-Perot etalon may be used as a wavelength selective filter element is a laser. A laser typically comprises a resonator cavity which is formed by two reflective elements, for example highly reflecting mirrors, and an active medium or gain medium arranged inside the cavity. The optical spectrum of the laser is limited by the spectral region over which the gain medium yields optical gain. For a semiconductor laser, for example, the typical width of the gain curve is 100 nm or more. Depending on the geometry of the cavity, the laser radiation has certain allowed spatial and spectral modes. The spatial modes of the laser are related to the light energy distribution transverse to the optical axis. The spectral modes which are also called longitudinal modes correspond to different wavelengths or frequencies of the light. The frequencies $f_N$ these modes are given by the formula:

$$f_N = N \cdot \frac{c}{2L} \quad (1)$$

wherein N is an integer, c is the speed of light and L is the optical path length of the laser cavity. Accordingly, the frequency spacing between two longitudinal modes thus is:

$$\Delta f = \frac{c}{2L} \quad (2)$$

The allowed radiation spectrum in a laser cavity thus is a discrete distribution of modal frequencies limited by the gain curve. For many applications, the use of a laser output radiation with the described frequency spectrum, i.e., with a mixture of several frequencies, is satisfactory. There are, however, more and more applications, for example in optical communication technology, spectroscopy or holography, wherein operation of the laser at a single axial mode is required. In order to achieve such single mode operation, filter elements have to be inserted in the laser cavity which reduce the bandwidth of the radiation.

Common coarse filter elements are diffraction gratings, or birefringent filters, or acousto-optic or electro-optic elements. In many applications, however, such elements cannot ensure single mode operation of the laser.

A further bandwidth reduction of the laser radiation can be achieved by using additional filter elements. From EP-A-0268411, for example, it is known (see FIG. 1) to use a tuning plate of transparent material in an external cavity laser to adjust a narrow bandwidth output radiation. A preferred choice for narrow bandwidth (high finesse) filter elements are Fabry-Perot etalons. The use of such etalons as wavelength selective elements in lasers is known, for example from U.S. Pat. No. 4,947,398. Basically, there are two types of Fabry-Perot etalons:

a) The gas-spaced etalon comprises two elements of glass or similar material the parallel end faces of which are arranged opposite to each other. A wavelength tuning with such an etalon can be achieved by varying the distance between the parallel end faces using piezoelectric translators. An etalon of this type is known from U.S. Pat. No. 4,097,818.

b) The solid-type etalon has a much simpler design than the gas-spaced etalon. It consists of a plane-parallel plate of transparent material the front and rear surfaces of which are coated with a reflecting coating. Since such an etalon consists only of one piece, no alignment of the etalon itself is required. A wavelength tuning with such an etalon is performed by tilting the etalon relative to the optical axis. The wavelength λ for which the etalon has maximum transmission is a function of the angle $\alpha$ of the surface normal of the etalon relative to the optical axis. The following relationship applies:

$$m \cdot \lambda = 2 \cdot d \cdot \sqrt{n^2 - \sin^2\alpha} \quad (3)$$

wherein n is the refractive index of the etalon material, d is the thickness of the etalon, and m is an integer characterizing the order of the transmission maximum.

The tilting is performed manually or by a motor-driven tilting arrangement. Typical tilting arrangements are tiltable or rotatable tables on which the etalon is mounted. The tilting axis in these arrangements is perpendicular to the optical axis. In order to achieve the required wavelength accuracy with such an arrangement, the mechanical precision of the drive for the etalon tilting and the positioning accuracy of the motor have to be very high. Such an arrangement is therefore complex and costly.

SUMMARY OF THE INVENTION

Relative to the mentioned prior art, the present invention solves the problem to provide a method and a corresponding apparatus for adjusting the wavelength in an optical device with a filter element which permits fast and easy adjustment of the wavelength with high accuracy, without requiring a complex and costly drive for the filter element. More particularly, a preferred embodiment of the invention solves the problem to provide a wavelength tunable laser apparatus which permits an accurate fine tuning of the laser output wavelength with a simple and inexpensive drive for the filter element.

According to an underlying principle of the invention, the wavelength selective filter element, for example a Fabry-Perot etalon, is fixed to a rotatable shaft. This shaft is inclined relative to the axis of the beam passing through the filter element, i.e., relative to the optical axis. Furthermore, the surface normal of the etalon is inclined relative to the shaft. As a consequence of these two inclinations, the angle of incidence ($\alpha$) of light impinging on the filter element varies when the shaft rotates. Since the angle of incidence ($\alpha$) defines the transmission wavelength of the filter element (see equation (3)), the rotation of the filter element causes a corresponding change in the wavelength. In that way, fine tuning of the wavelength is accomplished. Typically, the angle of incidence ($\alpha$) has to be changed only by a few degrees for fine tuning of the wavelength. According to an important aspect of the invention, the tuning across this small angular range is accomplished by rotating the shaft on which the filter element is fixed across a much larger angular range, typically 180 degrees. Consequently, a very high resolution in the adjustment of the angle of incidence can be achieved resulting in a very high accuracy of the wavelength adjustment. Since the adjustment of the angle of incidence is accomplished by a simple rotary motion, the drive unit for the etalon may have a comparatively simple design. This is in contrast to prior art devices which would require a much more complex design to achieve the same resolution.

The invention has the following additional advantages:

A high repeatability of the wavelength adjustment can be achieved when a position encoder for the rotation of the filter element is used, whereby the accuracy requirements of the encoder are substantially smaller than in prior art devices for changing the position of the filter element. A reason for the substantially improved repeatability is that the adjustment of small changes in the angle of incidence ($\alpha$) is accomplished by a much larger angular change in the rotation angle ($\delta$) of the shaft on which the filter element is fixed.

A further advantage is that the apparatus according to the invention is small in size and can be built with inexpensive components. The small size and the low weight of the components result in a low inertia of the apparatus. Consequently, the filter element can be rotated very quickly so that fast wavelength tuning is possible. Furthermore, the invention allows an easy calibration of the relationship between desired wavelength and motor position for this wavelength. According to a preferred embodiment of the invention, the filter element is a Fabry-Perot etalon comprising a plane-parallel plate of transparent material which has a semi-transparent coating on its front and on its rear surface. Such an etalon has a comparatively simple design and does not require any alignment since it consists of a single piece.

A preferred field of use for the invention is in a laser, wherein the filter element is arranged in the resonator cavity and serves for narrowing the bandwidth of the laser radiation and at the same time for tuning the output wavelength of the laser. The invention can be used in any type of lasers, for example in a gas laser, a solid state laser, or a dye laser. An example of a laser wherein the invention is used is an external cavity laser which comprises a semiconductor chip as gain medium. The resonator cavity is formed on one side by an end face of the semiconductor chip acting as a semi-transparent mirror due to Fresnel reflection, and on the other side by an adjustable diffraction grating. The grating is used for coarse adjustment of the laser output wavelength and the etalon is used for fine adjustment. This external cavity laser ensures single mode operation. Furthermore, it ensures adjustability of the wavelength in very small steps with very high accuracy.

When the filter element is inserted in the resonator cavity of a laser, the angle of inclination of the rotation axis of the etalon relative to the optical axis and of the surface normal of the etalon relative to the rotation axis are preferably selected such that the etalon surface is never perpendicular to the optical axis when the etalon performs a complete revolution. Otherwise, if there were such a position where the etalon surface is perpendicular to the optical axis, this surface would act as part of a new resonator cavity and disturb the operation of the laser.

The movement of the grating and of the etalon for adjusting a desired laser output wavelength is controlled with the help of calibration data stored in a memory. These calibration data are derived for each individual laser arrangement. Thus, any manufacturing tolerances of the components of the laser, such as the etalon or the grating, can be compensated.

It is understood that the invention is not limited to Fabry-Perot etalons as wavelength selective filter elements, but that other filter elements can be employed by means of which the wavelength is changed by a corresponding change in the angle of inclination of the filter element relative to the optical axis. An example of such an alternative filter element is a tuning plate arranged, for example, in the cavity of a laser. The beam is transmitted through the tuning plate which has an index of refraction which is different from its surrounding. Thus, the optical pathlength for the beam inside the cavity can be changed by rotating the tuning plate, resulting in a corresponding change in the output wavelength of the laser.

Furthermore, it is understood that the invention is not limited to an external cavity laser or other types of laser, but that it can also be used in other optical devices wherein a wavelength adjustment is required which has high resolution and high repeatability, but which does not involve high complexity and cost of the corresponding equipment.

Other features of the present invention are described below in connection with a detailed description of a preferred embodiment.

REFERENCE NUMERICAL LIST

Figure 1A:
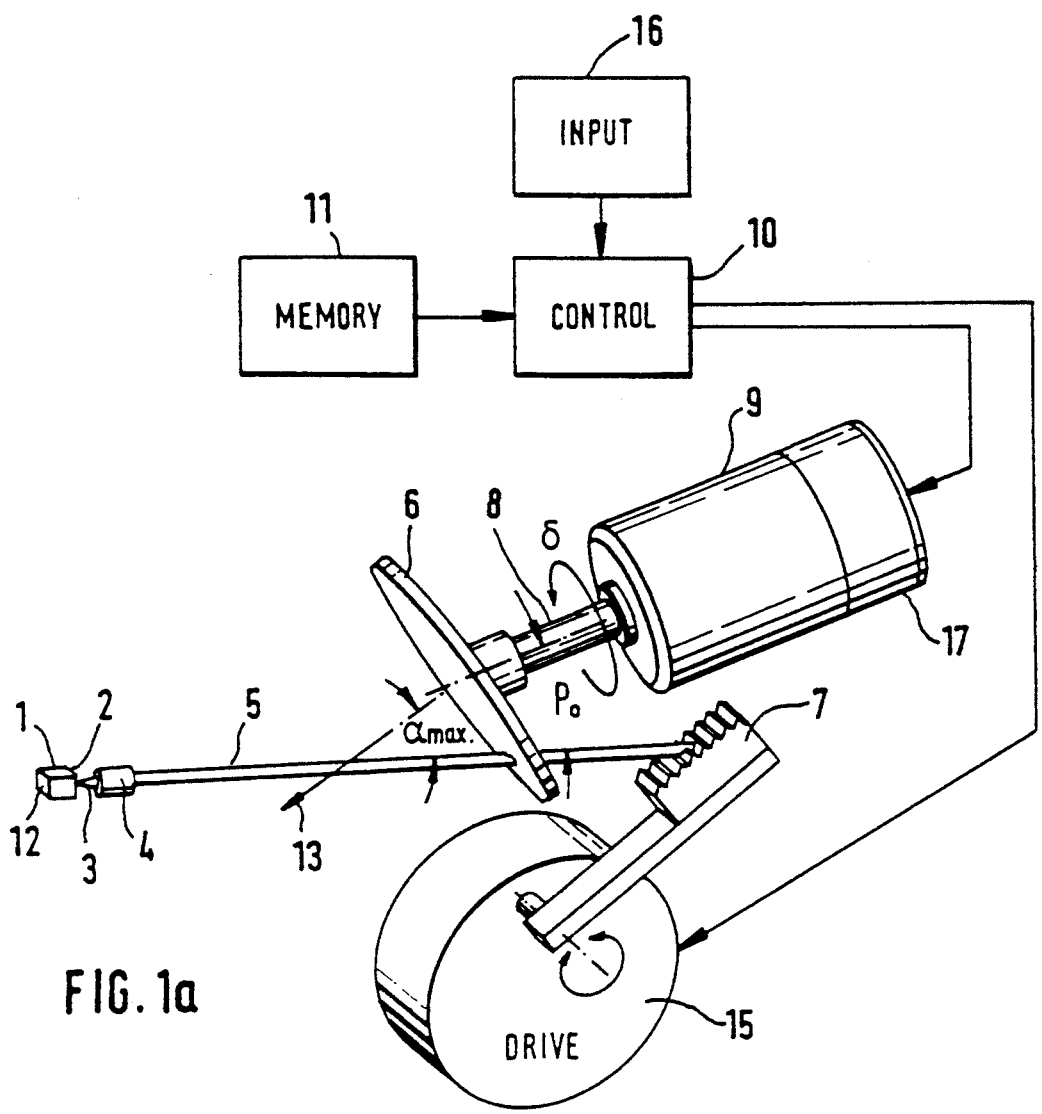
FIG. 1a schematically depicts an external cavity laser incorporating the invention.

The following is a listing of the reference numerals used herein:

1 semiconductor laser chip
2 antireflection coating of laser chip
3 light cone emerging from laser chip
4 selfoc lens
5 collimated light beam, optical axis
6 Fabry-Perot etalon 7 diffraction grating
8 motor shaft
9 drive means, motor, for etalon
10 control unit
11 memory
12 reflecting surface of laser chip 1
13 surface normal of etalon
14 nutation circle
15 drive unit for grating
16 input unit
17 position encoder for motor 9
40a, 40b reflection curve of grating
41a-g transmission maxima of etalon
LAMBDA 1 first calibration wavelength
LAMBDA 2 second calibration wavelength
LAMBDA d desired wavelength between LAMBDA 1 and LAMBDA 2
ANGLES
ALPHA angle between surface normal 13 of etalon and optical axis
DELTA rotation angle of etalon, angular orientation of etalon
DELTA u unknown angular position of etalon at beginning of calibration procedure
GAMMA Null angle between motor axis 8 and surface normal 13
RHO Null angle between motor axis 8 and optical axis 5.

DETAILED DESCRIPTION OF A PREFERRED EMBODIMENT

FIG. 1a schematically shows an external cavity laser wherein the active medium is a semiconductor laser chip 1. The semiconductor laser chip 1 is coated at one light exit face with an antireflection coating 2. The light cone 3 exiting from the semiconductor 1 is collimated by a selfoc lens 4. The diameter of the collimated beam 5 is approximately 1 mm. The collimated beam 5 is transmitted through a Fabry-Perot etalon 6 and thereafter impinges on a diffraction grating 7. The diffraction grating acts as a wavelength-selective mirror, i.e., only radiation of a specific wavelength λ is reflected back along the same path through the etalon 6, the selfoc lens 4 and the antireflection coating 2 into the semiconductor 1. The wavelength λ for which the grating acts as a plane mirror can be adjusted by rotating the grating around an axis by means of a drive unit 15. The drive unit 15 may comprise, for example, a stepping motor. The following formula applies for the wavelength λ for which the grating 7 acts as a mirror reflecting incident radiation of this wavelength back along the optical axis:

$$\lambda = 2 \cdot a \cdot \sin \Theta \qquad (4)$$

wherein a is the grating constant and Θ is the angle of incidence of the beam impinging on the grating.

The surface 12 of the semiconductor chip 1 which is opposite to the antireflection coating 2 acts as a reflecting surface for the radiation entering the semiconductor chip from the right through the lens 4. The reflectivity of the surface 12 which is perpendicular to an internal waveguide in the semiconductor laser chip 1 is due to the difference in refractive index between the semiconductor material and the surrounding air. The radiation reflected from the surface 12 again passes through the semiconductor chip 1 and then travels the same way as described above. The laser resonator within which the radiation to be amplified is reflected back and forth several times is thus formed by the surface 12 of the semiconductor 1 on one side and by the grating 7 on the other side.

In an embodiment of the invention, the semiconductor laser chip 1 is a p-substrate buried crescent laser containing indium, gallium arsenide, and phosphide. The radiation emitted by this material is in the infrared spectral range at 1540 nanometers (nm). The refractive index of this material is approximately 3.5 and the reflectivity at the surface 12 is approximately 31%.

As is shown in FIG. 1a, the Fabry-Perot etalon 6 is arranged on the shaft 8 of a motor 9. The motor axis 8 is inclined relative to the optical axis 5 by an angle $\rho_o$. The motor axis 8 is arranged above the optical axis 5 such that the projection of the motor axis 8 into a plane which is perpendicular to the plane of the paper and which contains the optical axis 5 coincides with the optical axis. As an alternative to this arrangement, the motor axis 8 could also be arranged parallel displaced thereto. A still further arrangement could be that the projection of the motor axis 8 into a plane perpendicular to the plane of the paper and containing the optical axis 5 intersects the optical axis. The motor 9 in the example shown is a DC motor and comprises an optical encoder 17 with the help of which a plurality of discrete angular positions of the etalon can be adjusted. In one specific embodiment, the encoder has 4096 increments per revolution. A DC motor has the advantage that it is inexpensive and does not require complex control circuitry.

The Fabry-Perot etalon used in the present embodiment comprises a plate of quartz glass which has a highly reflective coating on its front surface and on its rear surface. The front surface and the rear surface have to be parallel to each other, whereby the parallelism has to be maintained with very high accuracy. The surface normal of the etalon 6, i.e. a line which is perpendicular to the front surface of the etalon 6 is designated with reference numeral 13.

According to an important aspect of the invention, the etalon surface forms an angle with the motor axis 8 which differs from 90 degrees. The surface normal 13 of the etalon is inclined with respect to the motor shaft 8 by an angle $\gamma_o$. Due to this inclination, the etalon 6 is wobbling when the axis 8 is rotating. Consequently, the angle under which the beam 5 impinges on the etalon 6 varies as a function of the angle of rotation δ of the motor axis 8. If a denotes the angle between the surface normal 13 and the optical axis 5, the following formula applies for the variation of α as a function of the angle δ:

$$\cos \alpha = \sin \rho_o \cdot \sin \gamma_o \cdot \cos \delta + \cos \rho_o \cdot \cos \gamma_o \qquad (5)$$

Figure 1B:
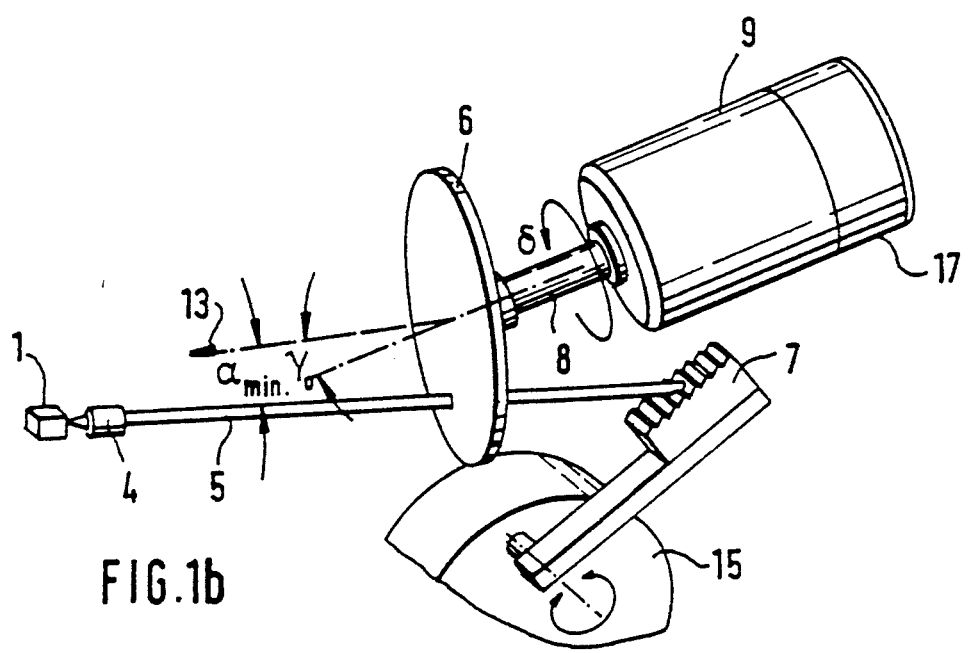
FIG. 1b shows the external cavity laser according to FIG. 1a with a different angular orientation of the etalon.

When the motor axis 8 rotates through an angle of 180 degrees, the angle α varies between a maximum value $\alpha_{max}$ and a minimum value $\alpha_{min}$. FIG. 1a depicts the angular orientation of the motor axis 8 for $\alpha_{max}$ and FIG. 1b depicts the angular orientation for $\alpha_{min}$. Since the wavelength at which the etalon has maximum transmission is a function of the angle α (see equation (3)), a wavelength tuning can be achieved by rotating the etalon.

Also shown in FIG. 1a is a control unit 10 for supplying control signals to the motor 9 and to the drive unit 15 of the grating 7 for adjusting the wavelength at which the external cavity laser is to oscillate, i.e., the wavelength of the laser output beam. The control unit 10 is connected to an input unit 16 by means of which an operator can enter the desired wavelength of the laser output beam. The adjustment of the wavelength is performed using calibration data stored in a memory unit 11, typically a programmable read-only-memory (PROM). Details of the adjustment will be explained below. For the sake of clarity, the blocks 10, 11, 15, and 16 are not shown in FIG. 1b.

Figure 2:
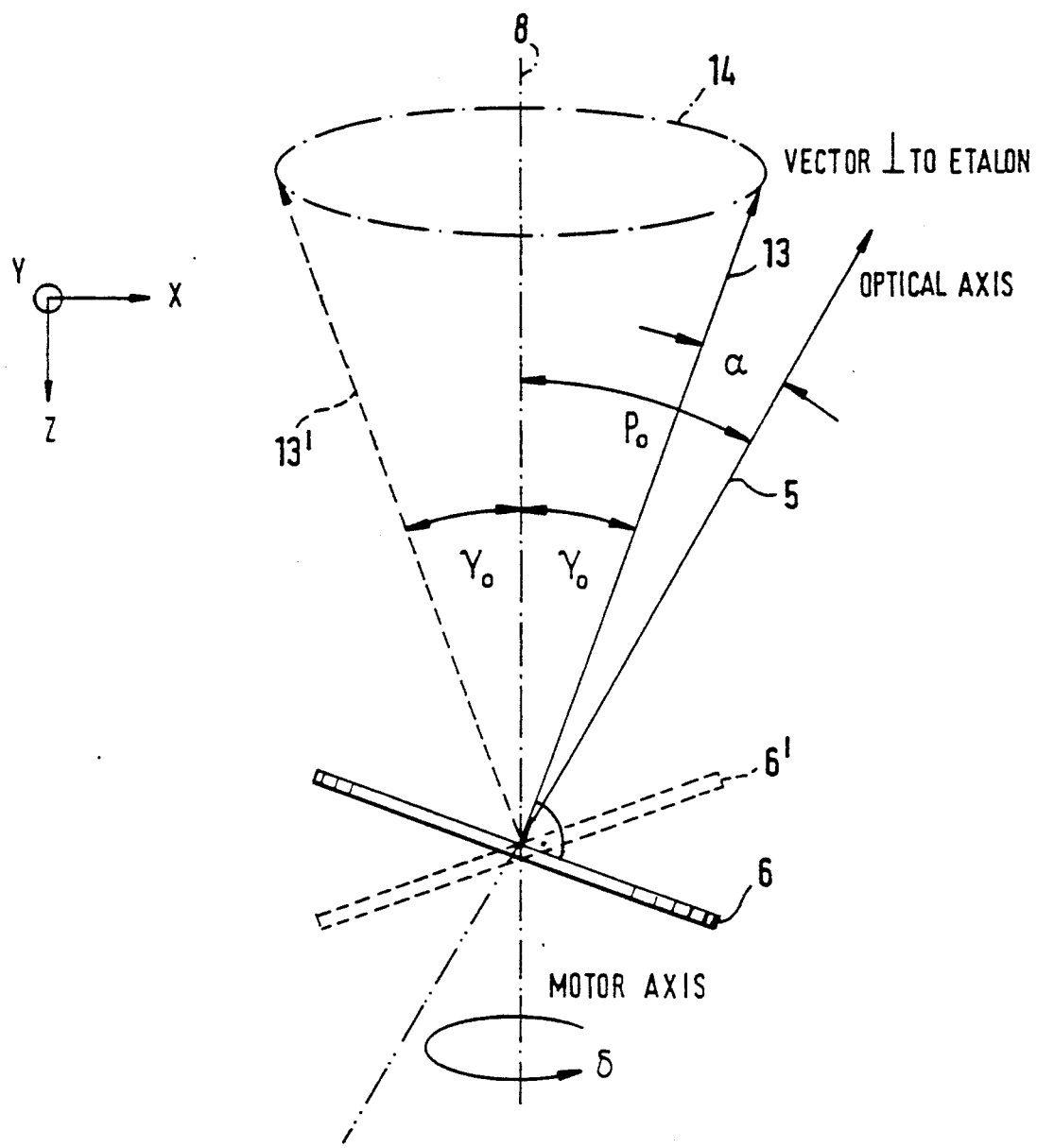
FIG. 2 is an illustration of the various angles and axes of the external cavity laser shown in FIGS. 1a and 1b.

FIG. 2 is a further illustration of the geometrical relationship of the various axes and angles of the in the laser according to FIGS. 1a and 1b. The etalon 6 is shown with its surface normal 13. The motor axis 8 passes through the center of the etalon 6. When the motor axis 8 rotates (angle $\delta$), the etalon 6 is wobbling or nutating, whereby the surface normal 13 describes a nutation circle 14. FIG. 2 depicts the two extreme positions of the etalon wherein the reference numeral 6 corresponds to the position when the angle $\alpha$ between the optical axis 5 and the surface normal 13 of the etalon is a minimum, and wherein the reference numeral 6' corresponds to the position when the angle $\alpha$ between the optical axis and the surface normal 13' for position 6' is a maximum. These two positions of the etalon correspond to the geometrical situations illustrated in FIGS. 1a and 1b, respectively. The angle $\rho_o$ between the motor axis 8 and the optical axis 5 and the angle $\gamma_o$ between the motor axis 8 and the surface normal to the etalon are fixed.

Since there is an inclination of the motor axis 8 relative to the optical axis 5 ($\rho_o$), it can be ensured by appropriate selection of the angles $\rho_o$ and $\gamma_o$ that the surface of the etalon 6 is never perpendicular to the optical axis 5 when the motor axis 8 performs a rotation by 360 degrees. This is important because if the etalon were perpendicular to the optical axis 5, it would act as reflecting element which would form together with the surface 12 a second, unwanted resonator cavity and thus disturb the operation of the external cavity laser. In particular, single mode operation of the external cavity laser would not be possible.

According to a practical example of the invention, the angle $\rho_o$ between the optical axis 5 and the motor axis 8 is 3 degrees, and the angle between the surface normal 13 and the motor axis 8 is 2 degrees. Using the above formula (3), it follows that $\alpha$ varies between 1 degree and 5 degrees. In this example, the used solid type etalon has a thickness of 0.5 mm and a diameter of 25 mm. Both etalon surfaces are coated with a reflection layer having a reflectivity of 60%.

The adjustment of a specific output wavelength of the external cavity laser is performed as follows:

A user enters the desired wavelength via the input means 16, for example via a keyboard or via an interface bus. In response thereto, the control unit 10 reads from the memory 11 the position of the grating 7 corresponding to this wavelength as well as the angular orientation of the etalon (angle $\delta$) for this wavelength. This information is converted by the control unit 10 into corresponding control signals for the motor 9 and for the drive unit 15 of the grating 7. The motor 9 and the drive unit 15 are then moved to the positions required for the specific wavelength.

The information about the positions of the grating 7 and of the etalon 6 corresponding to a certain wavelength is stored in the memory 11 in the form of two data arrays. The first data array contains the positioning information of the grating, i.e., a plurality of wavelength values and the corresponding position of the grating. If a desired wavelength value falls between two of the discrete values in the data array, a linear interpolation between these two values is performed to obtain the corresponding position of the grating. The adjustment of the grating position coarsely defines the laser wavelength. The grating thus functions as a wavelength preselector.

The fine tuning of the wavelength is accomplished by adjustment of the rotation angle $\delta$ of the etalon. The data for this adjustment are contained in the second data array. In a particular embodiment of the invention, it is assumed as an approximation that the wavelength change caused by rotating the etalon by a certain angle is constant over the tuning range of the laser and independent of the absolute wavelength. According to this approximation, the second data array thus contains a plurality of rotation angles of the etalon, typically from 0 to 180 degrees and the corresponding wavelength shifts.

Figure 3:
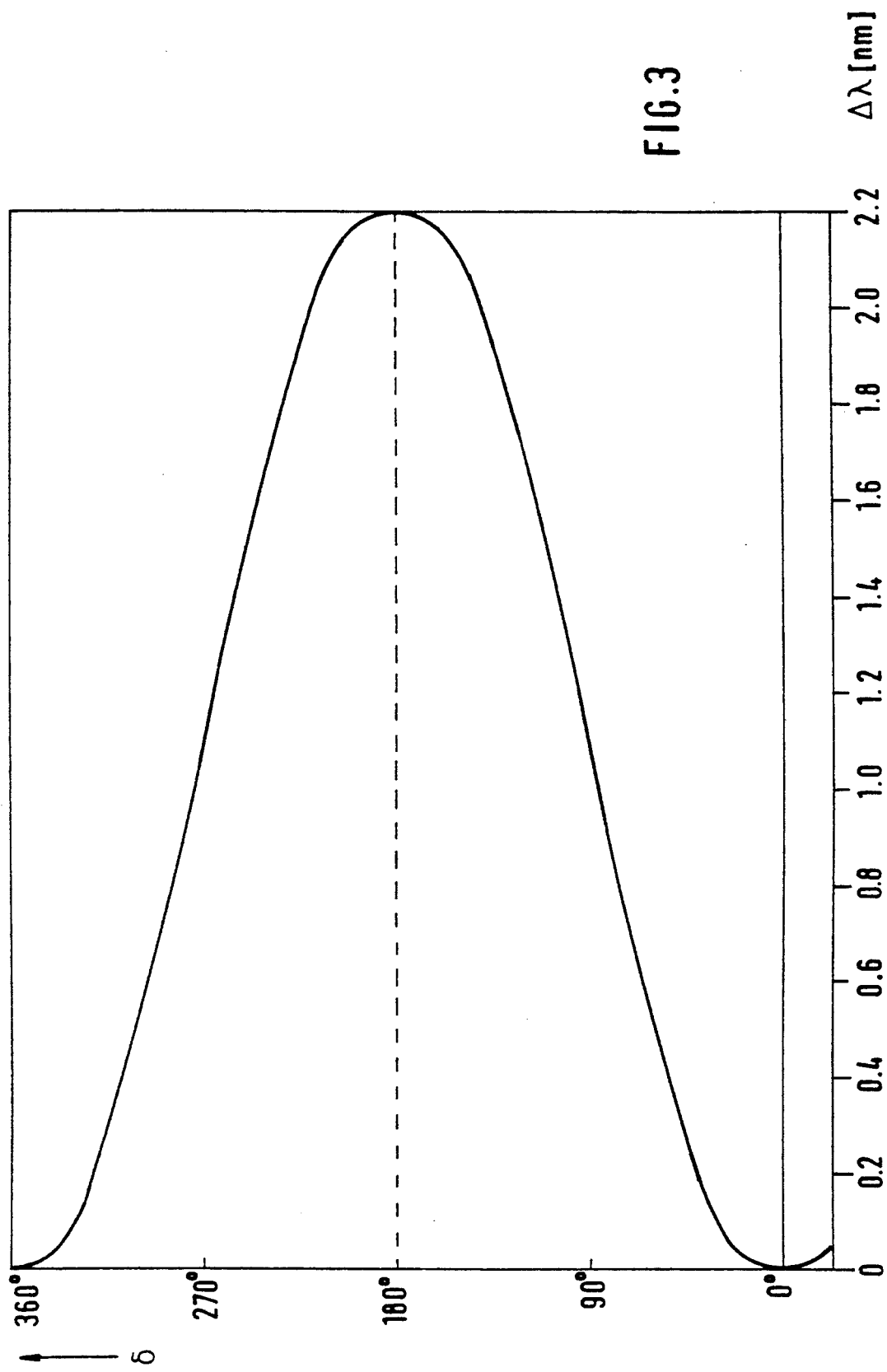
FIG. 3 is a graphical representation of the shift of the wavelength as a function of the rotation angle of the etalon shown in FIGS. 1a and 1b.

FIG. 3 serves for further illustrating the adjustment of the rotation angle of the etalon. It is a graphical representation of the actual wavelength shift $\Delta\lambda$ caused by a rotation of the etalon by an angle $\delta$. This graphical representation refers to the specific example of the invention the parameters of which are given above ($\gamma_o = 2$ degrees, $\rho_o = 3$ degrees, etalon thickness = 0.5 mm, refractive index = 1.44, wavelength of the emission line of the active medium: approx. 1540 nm). As is shown in FIG. 3, the curve is symmetrical around the angular position of 180 degrees so that for the adjustment of various wavelengths, only the angular range between 0 and 180 degrees (or between 180 degrees and 360 degrees) is required. As can be seen in the graphical representation, a rotation of the etalon between 0 and 180 degrees causes a variation of the wavelength within an interval of 2.2 nm. When an optical encoder with 4096 increments per revolution is used with the motor 9, the wavelength can be adjusted in steps of 0.001 nm. At each of these adjustable wavelengths, single mode operation of the laser is ensured; when tuning the laser output wavelength, the grating is also moved to ensure that the wavelength of the grating reflection maximum is located at the wavelength of an etalon transmission maximum. This will be explained in more detail below.

In the following, it is explained in more detail how the first and second data array are obtained for the external cavity laser shown in FIG. 1. It is important to note that the calibration data contained in the first and second data array are derived for each individual laser apparatus so that any manufacturing tolerances of the etalon or other components of the optical system are taken into account. For explaining the calibration procedure, reference is now made to FIG. 4.

Figure 4:
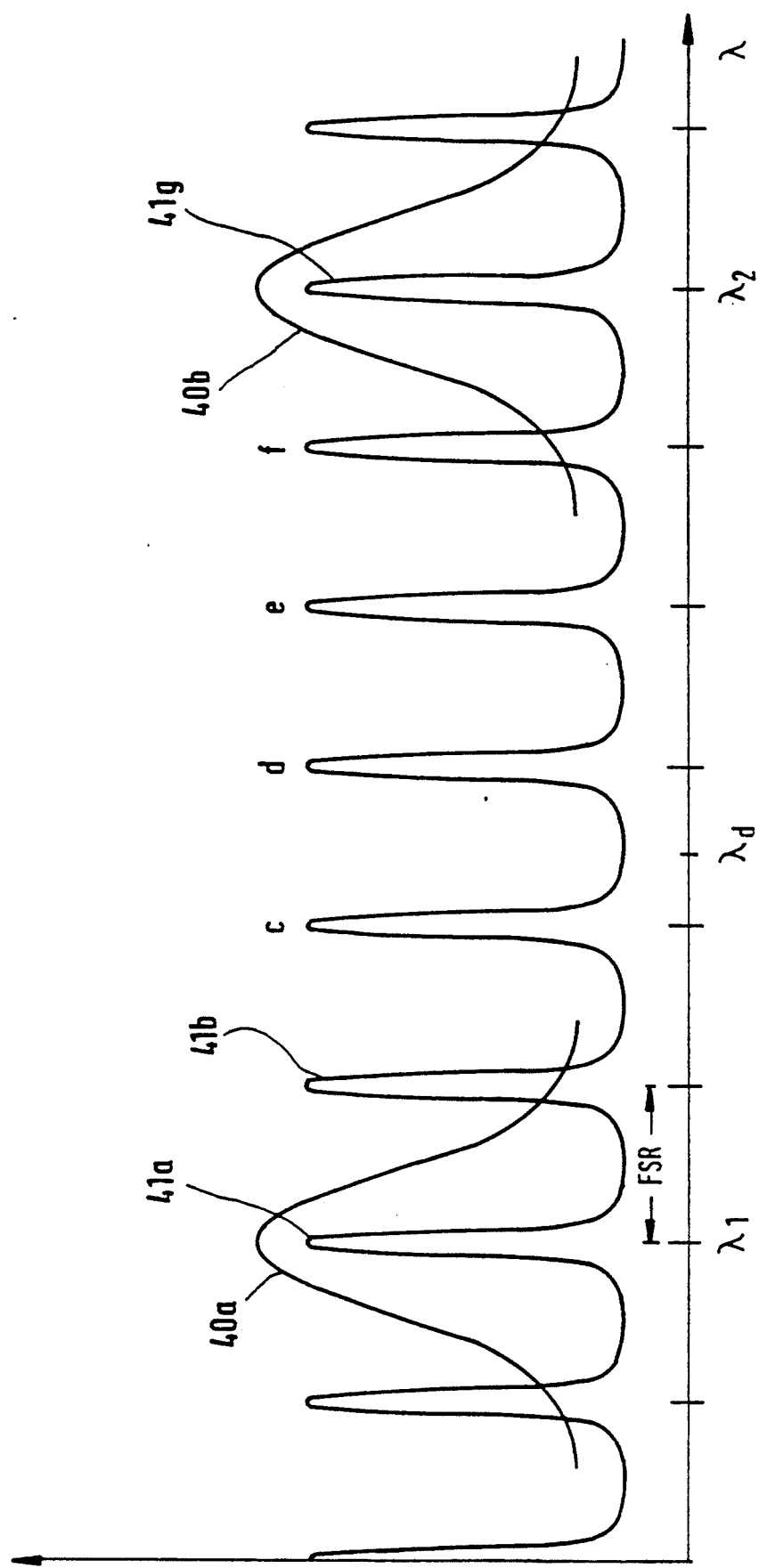
FIG. 4 is a graphical representation of the light intensity reflected from the grating and of the etalon transmission versus wavelength for the external cavity laser according to FIGS. 1a and 1b.

FIG. 4 is a graphical representation of the light intensity reflected from the grating 7 and of the transmission of the etalon 6, both as a function of the wavelength $\lambda$ of the incident light. The curves 40a and 40b represent the reflection curve of the grating at two different wavelengths $\lambda_1$ and $\lambda_2$, respectively, corresponding to two different angular orientations of the grating. The peaks 41a–41g represent the transmission maxima of the etalon at a fixed angular orientation the etalon. It can be seen that the width of the etalon transmission maxima is smaller than the width of the grating reflection curve. In the practical example mentioned above, the full width at half maximum (FWHM) of the etalon transmission maxima is approximately 0.1 nm and that of the grating reflection curve is approximately 1 nm.

In the first step of the calibration process, the angular orientation of the grating (or position of the motor drive 15) is determined for a plurality of discrete wavelength values, such as $\lambda_1$ and $\lambda_2$. For this purpose, the laser output beam is directed via an optical fiber (not shown) coupled to the exit face 12 and via an optical beam splitter to a high precision wavelength meter and to an optical power meter. Thus, the laser output wavelength and output power are measured simultaneously. The etalon 6 is arranged at a fixed, but unknown angular position ($\delta_u$). The grating 7 is now moved within the tuning range of the laser (around 1540 nm for the above mentioned example) until the output power is at a local maximum. If this is the case, the maximum of the grating reflection curve is located at a transmission maximum of the etalon. Such a situation is illustrated in FIG. 4 where the maximum of the curve 40a is at the etalon transmission maximum 41a. The corresponding wavelength $\lambda_1$ is determined with the wavelength meter. This wavelength and the grating position thus constitute the first data pair of the first calibration data array.

Thereafter, the grating 7 is moved by a fixed amount (for example 10 nm) to a second position, and then a tuning of the grating is performed until the output power is again a local maximum. This corresponds to the situation that the maximum of the curve 40b is located at the etalon transmission maximum 41g. The corresponding wavelength $\lambda_2$ and the grating position are stored as the second data pair of the first calibration array. Then, the grating is again moved by the fixed amount mentioned before and a tuning is performed to obtain the third data pair. This procedure is repeated several times according to the desired number of calibration points. The number of calibration points is selected according to the total tuning range of the external cavity laser. Later, when the laser is operated and a desired wavelength is to be adjusted which lies between two calibration wavelengths, a linear interpolation between these two wavelengths is made to derive the corresponding position of the grating drive.

As mentioned above, the etalon 6 is arranged at a fixed but unknown position ($\delta_u$) during the calibration of the grating. In the following, the calibration of the etalon rotation is described. This calibration is required for precisely adjusting a wavelength which is located between two transmission maxima of the etalon, for example the wavelength $\lambda_d$ between the points $\lambda_1$ and $\lambda_2$ in FIG. 4. In order to ensure maximum laser output power at $\lambda_d$, a transmission maximum of the etalon has to be at a maximum of the grating reflection curve. Thus, referring to FIG. 4, the etalon transmission curve has to be shifted such that the transmission maximum 41c is at the position $\lambda_d$. At the same time, the grating position has to be changed such that the grating reflection curve has its maximum at $\lambda_d$. The required grating position is derived by interpolation between the calibration points $\lambda_1$ and $\lambda_2$. The shift of the etalon transmission maximum to $\lambda_d$ is accomplished by appropriate rotation of the motor axis 8 on which the etalon is fixed. The angle by which the motor axis has to be rotated in order to shift the etalon transmission curve is taken from the second data array which contains a plurality of wavelength shifts $\Delta\lambda$ and the corresponding angle of rotation $\delta$. These data are obtained as follows:

First, a reference wavelength is selected at which the etalon 6 is at its above mentioned (unknown) position $\delta_u$ and the grating is arranged such that its reflection curve has its maximum at the etalon transmission maximum. Assume that this wavelength is $\lambda_2$ in FIG. 4. Now, the motor axis 8 is rotated by a fixed amount, for example 1 degree. The grating 7 is then slightly moved to the new wavelength measured by the wavemeter. Let the wavelength at this position of the etalon be $\lambda_{cal1}$. The data pair consisting of the difference between $\lambda_{cal1}$ and $\lambda_2$ and the angle of rotation of the axis 8 (1 degree in this example) is the first entry in the second data array. The rotation angle of the axis 8 is preferably expressed as the corresponding position of the motor position encoder 17 and stored in this form in the second data array. Then, the axis 8 is rotated further by the same fixed amount as above (1 degree in this example), the grating is again re-adjusted, the resulting wavelength is read, and the difference between this wavelength and $\lambda_2$ together with the total rotation angle (2 degrees) of the axis 8 is stored in the second data array. This procedure is continued until the etalon has completed a rotation by 180 degrees. Using the calibration data of the second data array, it is possible to adjust any wavelength shift between two transmission maxima. The wavelength range which can be covered by the etalon rotation is determined by the parameters of the etalon (d, n, $\rho_o$, $\gamma_o$). With the above mentioned parameters, this wavelength range is about 2.2 nm. If a desired wavelength shift lies between any two values in the second data array, a linear interpolation between these two is made to obtain the proper rotation angle of the axis 8.

Returning to the task of adjusting the wavelength $\lambda_d$ in FIG. 4, there is still one problem to solve: Even though it is now possible to shift the etalon transmission curve 41 by a desired wavelength interval, it still has to be determined by which amount it has to be shifted so that an etalon transmission maximum (such as 41c) is at the position $\lambda_d$. For this purpose, it has to be determined at which absolute wavelength positions the etalon transmission maxima at the etalon position angle $\delta_u$ are located. This is done in the following way:

First, two wavelengths are chosen which have been accurately measured with a wavelength meter in the above described first calibration procedure for determining the data array 1. Assume that these two wavelengths are $\lambda_1$ and $\lambda_2$ as shown in FIG. 4. A plurality of etalon transmission maxima 41b–f are located between $\lambda_1$ and $\lambda_2$. The wavelength difference between adjacent maxima is called free spectral range of the etalon (FSR) and satisfies the following formula:

$$FSR = \frac{\lambda^2}{2 \cdot d \sqrt{n^2 - \sin^2\alpha}} \quad (6)$$

wherein $\lambda$ is the wavelength transmitted through the etalon, n is the refractive index, and $\alpha$ is the angle of incidence.

Since the angle of incidence $\alpha_u$ at the initial angular position of the etalon is not known and since $\alpha$ is typically small (a few degrees), the approximation for equation (6) is made that the term $\sin^2\alpha$ is zero. Then, equation (6) reduces to $$FSR = \frac{\lambda^2}{2 \cdot d \cdot n} \quad (7)$$

As an approximation, $\lambda$ is selected to be $\lambda_1$. From this choice results a preliminary value for FSR.

Denoting the orders (corresponding to the factor m in equation (3)) of the etalon transmission maxima at $\lambda_1$ and $\lambda_2$ with $m_1$ and $m_2$, respectively, and the difference between $m_1$ and $m_2$ with $\Delta_m$, the following applies:

$$\Delta_m = \frac{\lambda_2 - \lambda_1}{FSR} \quad (8)$$

With the constraint that $\Delta_m$ has to be an integer and with $\lambda_1$ and $\lambda_2$ being known, equation (8) can be used to correct the preliminary value for FSR.

From equation (3), it follows:

$$\lambda_1 \cdot m_1 = \lambda_2 \cdot m_2 \quad (9)$$

which is equivalent to:

$$\Delta_m = \frac{\lambda_1 \cdot m_1}{\lambda_2} - m_1 \quad (10)$$

Using equations (8) and (10), $m_1$ is calculated. Now, using equation (9), the absolute wavelengths of the etalon transmission maxima subsequent to the maximum 41a are calculated. For example, the following applies for the wavelength $\lambda_{41b}$ at the etalon transmission maximum 41b which is the first after the transmission maximum at $\lambda_1$ (corresponding to the order $m_1$):

$$\lambda_1 \cdot m_1 = \lambda_{41b} \cdot (m_1 - 1) \quad (11)$$

All the following transmission maxima are calculated by the stepwise decreasing of the order m of the transmission by 1, respectively. The calculations are performed with a microprocessor which is part of the control unit 10 shown in FIG. 1.

Now, the wavelength difference between the desired wavelength $\lambda_d$ and the adjacent etalon transmission maximum (peak 41c) can be accurately determined. Then, it is looked up in the second data array to which rotation angle of the axis 8 (or difference in motor encoder positions) this wavelength difference corresponds. The axis 8 is then rotated by the amount read from the second data array.

The described calibration method is fast and comparatively simple. It has the further advantage that the initial angular position ($\alpha_u$) of the etalon need not be known. Furthermore, it takes into account any manufacturing tolerances of the optical and mechanical components.

The embodiment described above in connection with FIGS. 1a and 1b uses a Fabry-Perot etalon as a wavelength selective filter element. This is of course not the only possible filter element by which the invention can be realized. An alternative filter element could be a transparent tuning plate arranged in place of the etalon 6. Such a tuning plate has a refractive index which differs from its surrounding so that a rotation of the plate would cause a variation of the optical pathlength of the beam inside the cavity and thus permit fine tuning of the laser output wavelength.

Other modifications and variations of the preferred embodiment described herein will be within the time scope of the present invention. These modifications and variations are intended to be encompassed by the scope of protection of the following claims.

What is claimed is:

1. A method of adjusting the wavelength in an optical device, said device comprising a wavelength selective filter element through which radiation is transmitted along an optical axis, with the adjusted wavelength being dependent on the angle of inclination of the filter element relative to the optical axis, the method comprising the steps of:

inclining said wavelength selective filter element such that a surface normal of the filter element is inclined relative to a rotation axis about which the filter element is rotatable, wherein said rotation axis and said surface normal are inclined relative to said optical axis; and adjusting the wavelength of an output of the optical device by rotating the filter element about said rotation axis.

2. An apparatus for adjusting the wavelength in an optical device, said apparatus comprising a wavelength selective filter element through which radiation is transmitted along an optical axis, with the adjusted wavelength being dependent on the angle of inclination of the filter element relative to the optical axis, wherein the filter element is rotatable around a rotation axis which is inclined relative to the optical axis by an angle ($\rho_o$) and wherein a surface normal of the filter element is inclined relative to the rotation axis by an angle ($\gamma_o$).

3. A laser apparatus for providing an output beam at an output wavelength, comprising:

a resonator cavity comprising two reflective members, a gain medium arranged within said resonator cavity, a wavelength selective filter element within said resonator cavity through which radiation is transmitted along an optical axis, with the output wavelength of the laser apparatus being dependent on the angle of inclination of the filter element relative to the optical axis, a shaft to which the filter element is fixed such that the surface normal of the filter element is inclined relative to the shaft by an angle ($\gamma_o$), with the shaft being inclined relative to the optical axis by an angle ($\rho_o$), and drive means for rotating the shaft by a selectable angle ($\delta$).

4. A laser apparatus as in claim 3, wherein the wavelength selective filter element is a Fabry-Perot etalon comprising a plane-parallel plate of transparent material.

5. A laser apparatus as in claim 4, wherein the angle of inclination ($\gamma_o$) of the surface normal of the filter element relative to the shaft and the angle of inclination ($\rho_o$) of the shaft relative to the optical axis are different from each other such that the surface of the filter element is never perpendicular to the optical axis when the shaft performs a complete revolution by 360 degrees.

6. A laser apparatus as in claim 3, wherein the wavelength selective filter element is a tuning plate of transparent material by which the optical pathlength within the resonator cavity can be changed.

7. A laser apparatus as in claim 6, wherein the angle of inclination ($\gamma_o$) of the surface normal of the filter element relative to the shaft and the angle of inclination ($\rho_o$) of the shaft relative to the optical axis are different from each other such that the surface of the filter element is never perpendicular to the optical axis when the shaft performs a complete revolution by 360 degrees.

8. A laser apparatus as in claim 3, wherein the angle of inclination ($\gamma_o$) of the surface normal of the filter element relative to the shaft and the angle of inclination ($p_o$) of the shaft relative to the optical axis are different from each other such that the surface of the filter element is never perpendicular to the optical axis when the shaft performs a complete revolution by 360 degrees.

9. A laser apparatus as in claim 8, further comprising a memory wherein calibration data for the wavelength adjustment by means of the filter dement are stored, said calibration data indicating for a plurality of rotation angles ($\alpha$) of the axis, the wavelength change caused by the rotation of the shaft by each of said plurality of rotation angles.

10. A laser apparatus as in claim 9, wherein first reflective member of the resonator cavity is formed by a surface of the gain medium and a second reflective member is formed by an adjustable diffraction grating, and the memory further comprises calibration data about the wavelengths of the radiation reflected from the grating corresponding to selected positions of the grating, respectively.

11. A laser apparatus as in claim 3, wherein a first reflective member of the resonator cavity is formed by a surface of the gain medium and a second reflective member is formed by an adjustable diffraction grating.

12. A laser apparatus as in claim 11, wherein a drive unit is provided for adjusting various positions of the grating, such that at different positions of the grating, radiation of a different wavelength is reflected back along the optical axis.

13. A laser apparatus as in claim 3, wherein the drive means for rotating the filter element comprises a position encoder for determining the angular orientation ($\delta$) of the shaft.

14. A laser apparatus as in claim 3, further comprising a memory wherein calibration data for the wavelength adjustment by means of the filter element are stored, said calibration data indicating for a plurality of rotation angles ($\alpha$) of the axis, the wavelength change caused by the rotation of the shaft by each of said plurality of rotation angles.

15. A laser apparatus as in claim 14, wherein a first reflective member of the resonator cavity is formed by a surface of the gain medium and a second reflective member is formed by an adjustable diffraction grating, and the memory further comprises calibration data about the wavelengths of the radiation reflected from the grating corresponding to selected positions of the grating, respectively.

16. A laser apparatus as in claim 14, wherein a first reflective member of the resonator cavity is formed by a surface of the gain medium and a second reflective member is formed by an adjustable diffraction grating, and a drive unit is provided for adjusting various positions of the grating, such that at different positions of the grating, radiation of a different wavelength is reflected back along the optical axis.

17. A laser apparatus as in claim 14, comprising:
an input unit for entering a desired output wavelength of the laser apparatus,
a control unit coupled to the input unit, to the memory, and to the drive means for the filter element as well as to the drive unit for the grating, said control unit including means for determining from the desired output wavelength and from the calibration data stored in the memory, if necessary by interpolating the stored calibration data, the position of the grating and the angular orientation of the axis which correspond to the desired output wavelength, and providing corresponding control signals to the drive means and to the drive unit.

18. A laser apparatus as in claim 3, wherein the gain medium comprises a semiconductor material.

* * * * *